(12) United States Patent
Kuwahara (10) Patent No.: US 7,303,403 B2
(45) Date of Patent: Dec. 4, 2007

(54) ELECTRICAL CONNECTING MEMBER CAPABLE OF ACHIEVING STABLE CONNECTION WITH A SIMPLE STRUCTURE AND CONNECTOR USING THE SAME

(75) Inventor: Akira Kuwahara, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 11/412,292

(22) Filed: Apr. 27, 2006

(65) Prior Publication Data

US 2006/0244111 A1  Nov. 2, 2006

(30) Foreign Application Priority Data

Apr. 28, 2005   (JP)  ............................. 2005-132391

(51) Int. Cl.
*H01R 12/00*   (2006.01)
(52) U.S. Cl. .................................................... 439/66
(58) Field of Classification Search ................ 439/66, 439/67, 71, 91
See application file for complete search history.

(56) References Cited

U.S. PATENT DOCUMENTS

| | | | | | |
|---|---|---|---|---|---|
| 3,924,915 | A | * | 12/1975 | Conrad | 439/66 |
| 3,951,493 | A | * | 4/1976 | Kozel et al. | 439/591 |
| 3,960,424 | A | * | 6/1976 | Weisenburger | 439/66 |
| 3,985,413 | A | * | 10/1976 | Evans | 439/66 |
| 3,998,512 | A | * | 12/1976 | Anhalt et al. | 439/66 |
| 4,057,311 | A | * | 11/1977 | Evans | 439/66 |
| 4,203,203 | A | * | 5/1980 | Gilissen et al. | 29/846 |
| 4,344,662 | A | * | 8/1982 | Dalamangas et al. | 439/91 |
| 4,636,018 | A | * | 1/1987 | Stillie | 439/66 |
| 4,859,189 | A | * | 8/1989 | Petersen et al. | 439/66 |
| 5,035,628 | A | * | 7/1991 | Casciotti et al. | 439/66 |
| 5,259,770 | A | * | 11/1993 | Bates et al. | 439/66 |
| 5,273,439 | A | * | 12/1993 | Szerlip et al. | 439/66 |
| 5,273,440 | A | * | 12/1993 | Ashman et al. | 439/71 |
| 5,468,996 | A | * | 11/1995 | Chan et al. | 257/723 |
| 5,530,291 | A | * | 6/1996 | Chan et al. | 257/723 |
| 5,554,036 | A | * | 9/1996 | Shirai et al. | 439/74 |
| 5,632,626 | A | * | 5/1997 | Collins et al. | 439/66 |
| 6,241,533 | B1 | * | 6/2001 | Matsumoto | 439/67 |
| 6,403,226 | B1 | * | 6/2002 | Biernath et al. | 428/447 |
| 7,121,837 | B2 | * | 10/2006 | Sato et al. | 439/66 |
| 2001/0041465 | A1 | * | 11/2001 | Szalay et al. | 439/67 |
| 2005/0245107 | A1 | * | 11/2005 | Takahashi et al. | 439/66 |

FOREIGN PATENT DOCUMENTS

| | | |
|---|---|---|
| JP | 5074512 | 3/1993 |
| JP | 2002056907 | 2/2002 |
| JP | 2005038700 | 2/2005 |

* cited by examiner

*Primary Examiner*—Briggitte Hammond
*Assistant Examiner*—Larisa Tsukerman
(74) *Attorney, Agent, or Firm*—Collard & Roe, P.C.

(57) ABSTRACT

In an electrical connecting member for electrical connection with a connection object, the electrical connecting member includes an elastic body having a pair of protruding portions protruding in directions opposite to each other. An insulating film extends along the elastic body to cover the protruding portions. A conductor portion is formed along the film and extending between portions corresponding to the protruding portions. It is preferable that each of the protruding portions has a plurality of projections, adjacent ones of which is separated by a groove from one another. In this case, the conductor portions are formed in correspondence to the projections.

6 Claims, 7 Drawing Sheets

ELECTRICAL CONNECTING MEMBER CAPABLE OF ACHIEVING STABLE CONNECTION WITH A SIMPLE STRUCTURE AND CONNECTOR USING THE SAME

This application claims priority to prior Japanese patent application JP 2005-132391, the disclosure of which is incorporated herein by reference.

BACKGROUND OF THE INVENTION

This invention relates to an electrical connecting member for use in electrical connection with a connection object and a connector using the same.

A typical electronic apparatus comprises a housing containing a substrate, a connector mounted on the substrate, and electronic parts connected to the connector. In recent years, the electronic apparatus is reduced in size and, consequently, the electronic parts are required to be reduced in size. Within a limited space, it is desired that the connector is reduced in size, increased in number of contacts, and narrowed in pitch.

For example, Japanese Unexamined Patent Application Publication (JP-A) No. H5-74512 discloses an electrical connector in which a plurality of balls provided with a conductive thin film formed thereon are embedded in a resin film. However, this electrical connector is not excellent in mass-productivity and is not easily adaptable to the increase in number of contacts because the balls are embedded in the resin film one by one.

Japanese Unexamined Patent Application Publication (JP-A) No. 2002-56907 discloses an electrical connecting member comprising an insulating sheet having opposite surfaces coated with an adhesive and conductive fibers set in the insulating sheet. However, this electrical connecting member is poor in retryability because, upon occurrence of an error in a step of setting the conductive fibers, not only the conductive fibers but also the insulating sheet with pierced holes formed therein by setting the conductive fibers must be discarded.

Japanese Unexamined Patent Application Publication (JP-A) No. 2005-38700 discloses a connector in which a contact is attached to an insulator by adhesiveness. However, this connector is disadvantageous in that the contact is less compliant with a terminal of a substrate as a connection object.

SUMMARY OF THE INVENTION

It is therefore an object of this invention to provide an electrical connecting member and a connector which allows a low connecting pressure, solderless fixation, and a number of times of repetition of connecting and disconnecting operations and is yet capable of realizing stable connection.

It is another object of this invention to provide an electrical connecting member and a connector which can easily be reduced in size, increased in number of contacts, and narrowed in pitch within a limited space.

Other objects of the present invention will become clear as the description proceeds.

According to an aspect of the present invention, there is provided an electrical connecting member for electrical connection with a connection object, the electrical connecting member comprising an elastic body having a pair of protruding portions protruding in directions opposite to each other, an insulating film extending along the elastic body to cover the protruding portions, and a conductor portion formed along the film and extending between portions corresponding to the protruding portions.

According to an aspect of the present invention, there is provided a connector which is disposed between two connection objects faced to each other and which serves to electrically connect the connection objects to each other, the connector comprising an insulator having a holding hole as a through hole and an electrical connecting member inserted into the holding hole, the electrical connecting member comprising an elastic body having a pair of protruding portions protruding from the insulator towards the two connection objects, respectively, an insulating film extending along the elastic body to cover the protruding portions, and a conductor portion formed along the film and extending between portions corresponding to the protruding portions.

DESCRIPTION OF THE PREFERRED EMBODIMENTS

Figure 1:
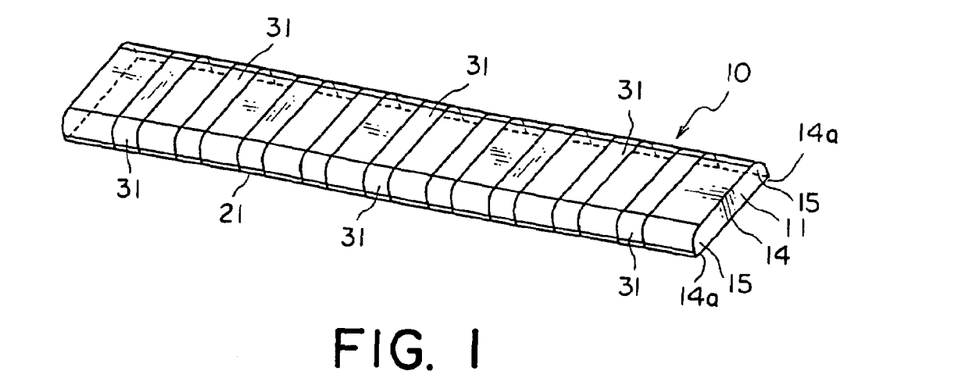
FIG. 1 is a perspective view of an electrical connecting member according to a first embodiment of this invention.
Figure 2:
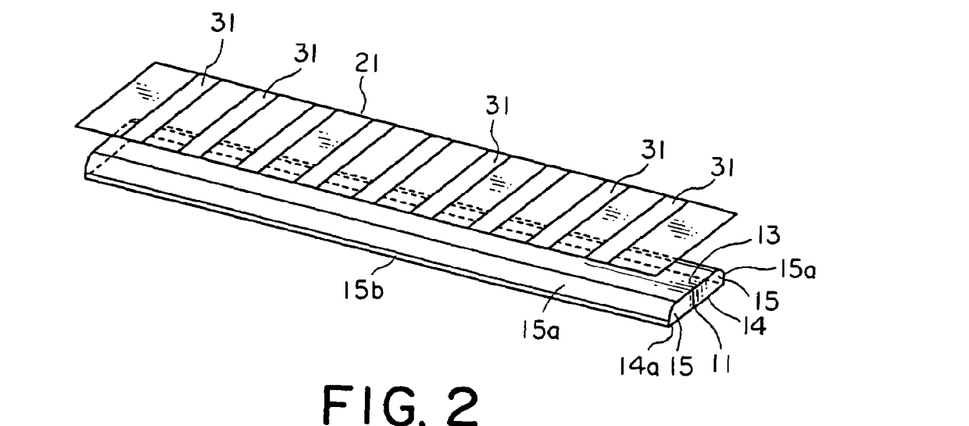
FIG. 2 is an exploded perspective view of the electrical connecting member illustrated in FIG. 1.

Referring to FIGS. 1 and 2, description will be made of an electrical connecting member according to a first embodiment of this invention.

In FIGS. 1 and 2, the electrical connecting member 10 comprises an elastic body 11, an insulating film 21 held by the elastic body 11, and a plurality of conductor portions 31 formed on the film 21. The elastic body 11 has a generally rectangular plate-like shape and has a holding surface 13 holding the film 21 and a flat base surface 14 opposite to the holding surface 13. The conductor portions 31 are disposed on a surface of the film 21 on a side opposite to the holding surface 13.

The elastic body 11 has a pair of protruding portions 15 protruding from opposite sides in a widthwise direction perpendicular to a longitudinal direction, respectively. Each of the protruding portions 15 has a protruding base surface 14a of a flat shape extending from the base surface 14, a curved surface 15a formed as a generally cylindrical surface protruding from the holding surface 13 towards the protruding base surface 14a, and a side surface 15b perpendicular to the protruding base surface 14a and connecting the curved surface 15a and the protruding base surface 14a.

The film 21 is held on the elastic body 11 to entirely cover the holding surface 13 of the elastic body 11. The conductor portions 31 are disposed on the surface of the film 21 as strip-like patterns spaced from one another in a longitudinal direction of the film 21 and extending in a widthwise direction of the film 21 perpendicular to the longitudinal direction. Thus, each of the conductor portions 31 is formed on the holding surface 13 via the film 21 as a wiring pattern corresponding to the protruding portions 15 and to a portion between the protruding portions 15.

The conductor portions 31 on one of the protruding portions 15 are contacted with a connection object (not shown) comprising a wiring board. The conductor portions 31 on the other protruding portion 15 are contacted with another connection object (not shown) comprising another wiring board. Therefore, these connection objects are connected to each other via the conductor portions 31.

The elastic body 11 may be formed by a well-known technique. The conductor portions 31 are obtained by patterning a metal thin film on the film 21. By the use of a fine processing technique such as plating, sputtering, or etching, the metal thin film can be deposited on the film 21 on the order of several microns. Further, the conductor portions 31 can be arranged at intervals of 0.5 mm or less in the longitudinal direction of the film 21 so that a narrow-pitch arrangement is possible. As the film 21, a FPC (Flexible Printed Circuit) may be used.

The film 21 is adhered and fixed to the holding surface 13 of the elastic body 11 so as to be compliant therewith. Preferably, the elastic body 11 is made of a rubber material having heat resistance, such as a silicon-based rubber material. The elastic body 11 may be made of a gel material.

The elastic body 11 and the film 21 may be adhered to each other by applying an adhesive or a coupling agent to at least one of the elastic body 11 and the film 21. Alternatively, the elastic body 11 and the film 21 may be adhered by thermal welding. The film 21 may be formed by using one kind of resin, such as polyimide resin or aramid resin.

Figure 3:
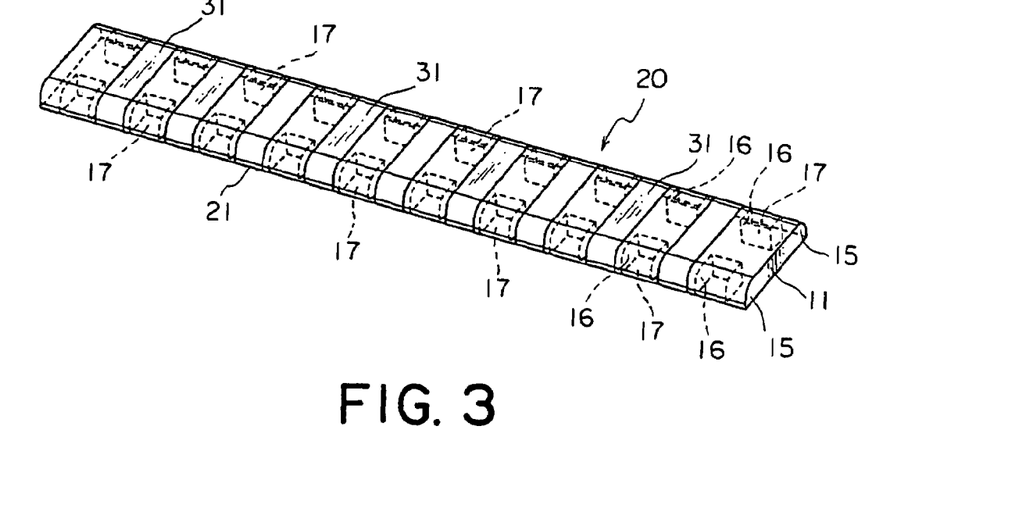
FIG. 3 is a perspective view of an electrical connecting member according to a second embodiment of this invention.
Figure 4:
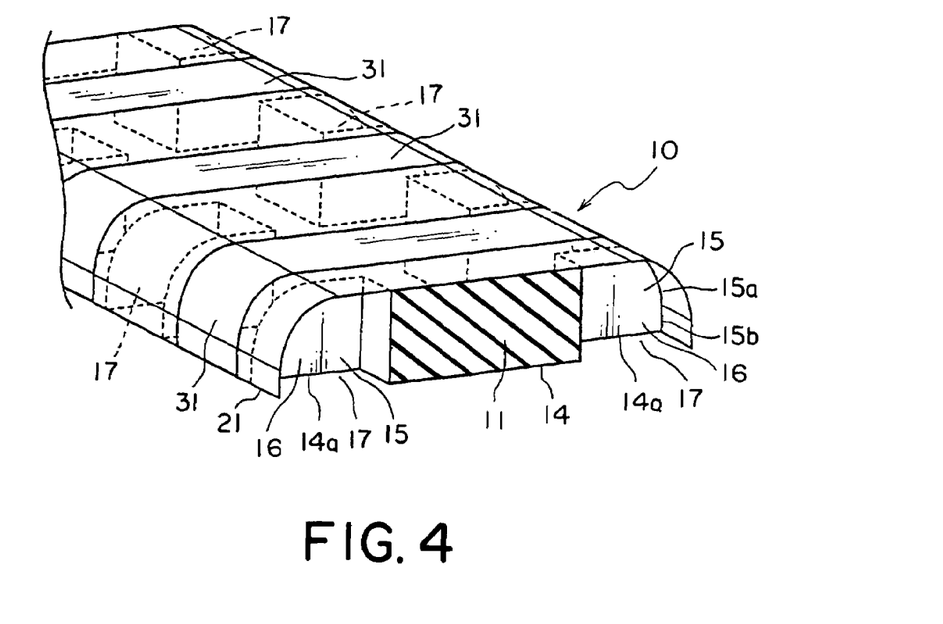
FIG. 4 is an enlarged sectional perspective view of a part of the electrical connecting member illustrated in FIG. 3.

Referring to FIGS. 3 and 4, description will be made of an electrical connecting member according to a second embodiment of this invention. Similar parts to those of the electrical connecting member 10 illustrated in FIGS. 1 and 2 are designated by like reference numerals and description thereof will be omitted.

In the electrical connecting member 20 in FIGS. 3 and 4, the elastic member 11 has a plurality of grooves 17 formed on the protruding portions 15. Consequently, each of the protruding portions 15 is divided into a plurality of projections 16 separated by the grooves 17 from one another. In other words, each groove 17 is positioned between adjacent ones of the projections 16. Each projection 16 is defined by the grooves 17, the curved surface 15a, the side surface 15b, and the protruding base surface 14a.

The grooves 17 formed in the elastic body 11 serve as a relief space for the elastic member 11 when the elastic member 11 is compressed and deformed in the widthwise direction. Therefore, improvement in deformability of the electrical connecting member under a given load is expected. By changing the shape of the grooves 17, it is possible to easily change the deformability of the electrical connecting member.

When the film 21 is held by the elastic member 11, the conductor portions 31 are disposed at positions corresponding to the projections 16. In other words, the grooves 17 are formed at positions corresponding to spaces between every adjacent ones of the conductor portions 31. The film 21 extends to cover the grooves 17.

Figure 5:
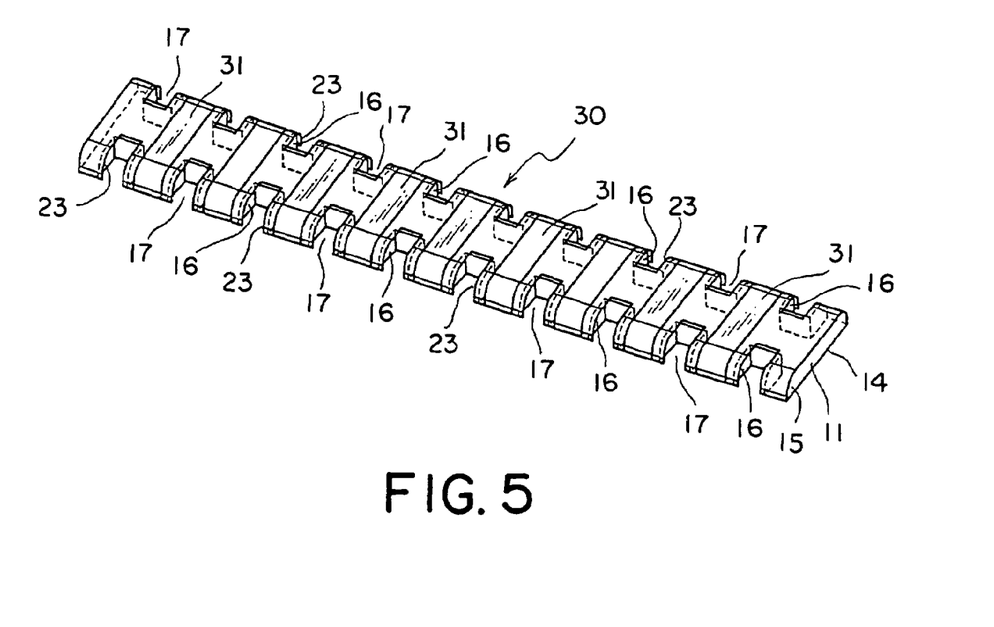
FIG. 5 is a perspective view of an electrical connecting member according to a third embodiment of this invention.
Figure 6:
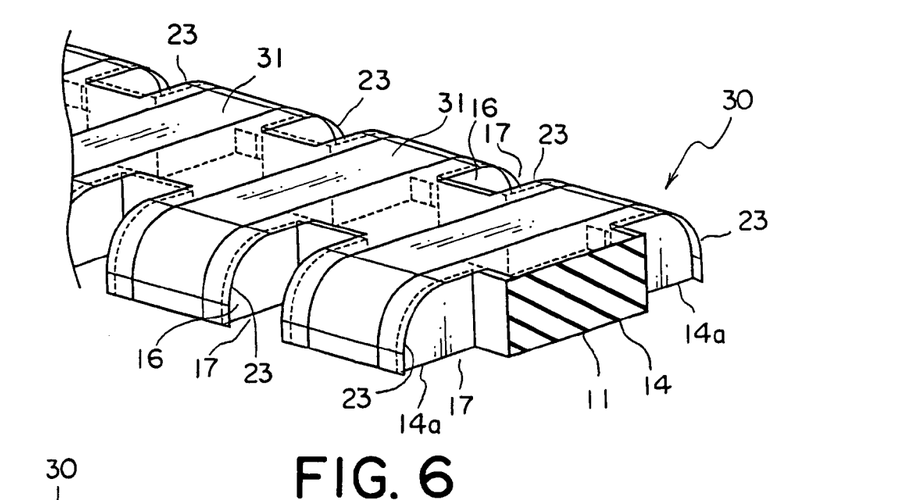
FIG. 6 is an enlarged sectional perspective view of a part of the electrical connecting member illustrated in FIG. 5.

Referring to FIGS. 5 and 6, description will be made of an electrical connecting member according to a third embodiment of this invention. Similar parts to those of the electrical connecting member 20 illustrated in FIGS. 3 and 4 are designated by like reference numerals and description thereof will be omitted.

In the electrical connecting member 30 illustrated in FIGS. 5 and 6, a film 21 has a plurality of cutout portions 23 formed by cutting those parts faced to the grooves 17 of the elastic member 11. By forming the cutout portions 23 in the film 21, each part of the elastic member 11 between adjacent conductor portions 31 can independently be deformed. Therefore, with respect to distortion or warping of the connection object as well as a slight difference in height of the conductor portions 31, it is possible to achieve stable connection at the level of the conductor portions 31.

Next referring to FIGS. 7 and 8, description will be made of a first example of a connector using the electrical connecting member 30 illustrated in FIG. 5.

Figure 7:
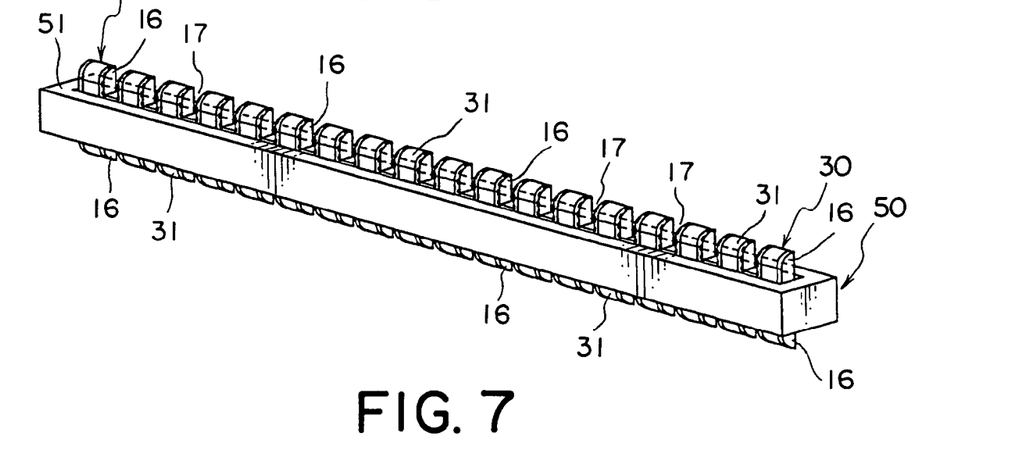
FIG. 7 is a perspective view of a first example of a connector using the electrical connecting member illustrated in FIG. 5.
Figure 8:
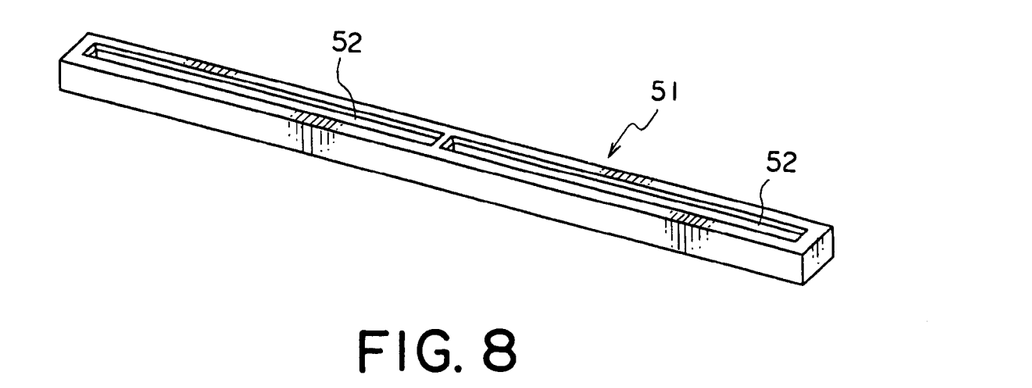
FIG. 8 is a perspective view of an insulator used in the connector illustrated in FIG. 7.

A connector 50 illustrated in FIG. 7 comprises an insulator 51 as a frame. As shown in FIG. 8, the insulator 51 has a long rod-like shape and is provided with two holding holes 52 as long through holes extending in a longitudinal direction and serially arranged adjacent to each other in a longitudinal direction. The electrical connecting member 30 is inserted into each of the holding holes 52 and fixed to the insulator 51. In this state, the projections 16 protrude outward from the insulator 51. Therefore, opposite ends of each conductor portion 31 are also exposed.

In the connector 50, the holding holes 52 are formed in the insulator 51 in conformity with arrangement of the contacting portions of the connection object. The electrical connecting member 30 adapted to the number and the positions of the contacting portions of the connection object is inserted into each of the holding holes 52 and held. The connector 50 mentioned above is simple in structure and is therefore easy in manufacture, high in versatility, and excellent in mass-productivity.

Figure 9:
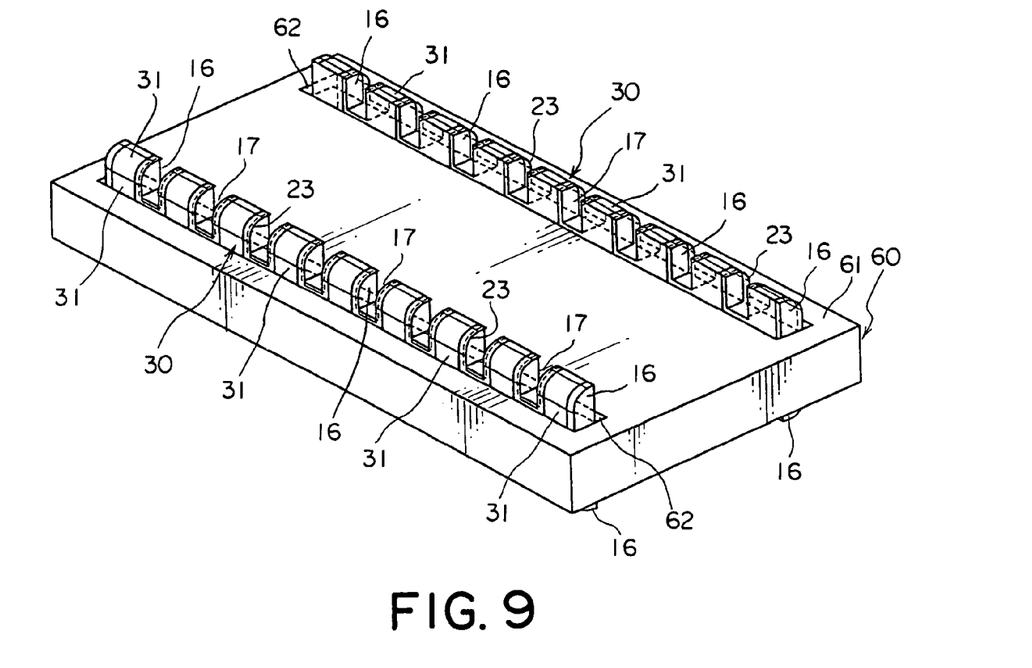
FIG. 9 is a perspective view of a second example of a connector using the electrical connecting member illustrated in FIG. 5.
Figure 10:
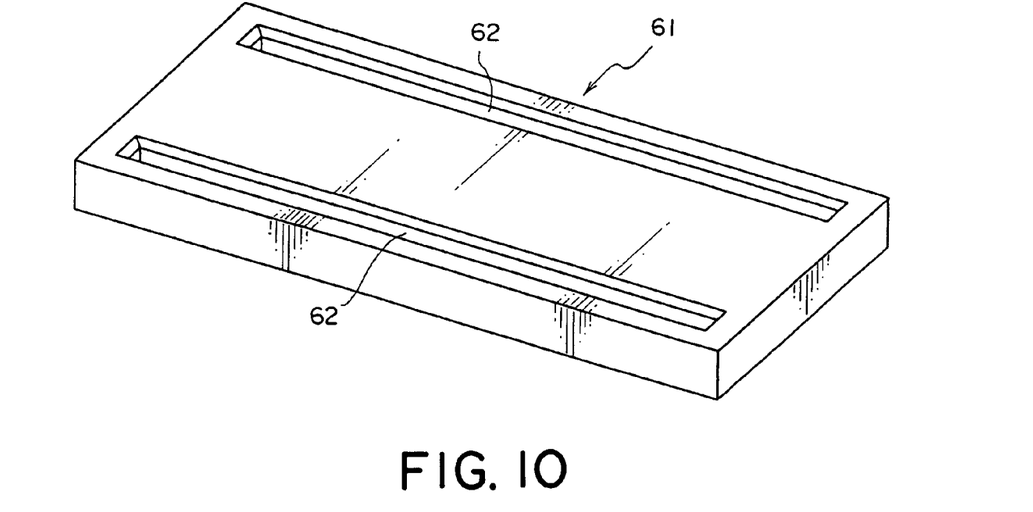
FIG. 10 is a perspective view of an insulator used in the connector illustrated in FIG. 9.

Referring to FIGS. 9 and 10, description will be made of a second example of a connector using the electrical connecting member 30 illustrated in FIG. 5.

A connector 60 illustrated in FIG. 9 comprises an insulator 61 as a frame. As shown in FIG. 10, the insulator 61 has a rectangular flat plate-like shape and is provided with two holding holes 62 formed along its edges extending in a longitudinal direction and arranged in parallel to each other. Each of the holding holes 62 is a long through hole penetrating the insulator 61 in a thickness direction. The electrical connecting member 30 is inserted into each of the holding holes 62 and fixed to the insulator 61. In this state, the projections 16 protrude outward from the insulator 61. Therefore, the opposite ends of each conductor portion 31 are also exposed.

In the connector 60, the holding holes 62 are formed in the insulator 61 in conformity with arrangement of the contacting portions of the connection object. The electrical connecting member 30 adapted to the number and the positions of the contacting portions of the connection object is inserted into each of the holding holes 62 and held therein. The connector 60 mentioned above is simple in structure and is therefore easy in manufacture, high in versatility, and excellent in mass-productivity.

Figure 11:
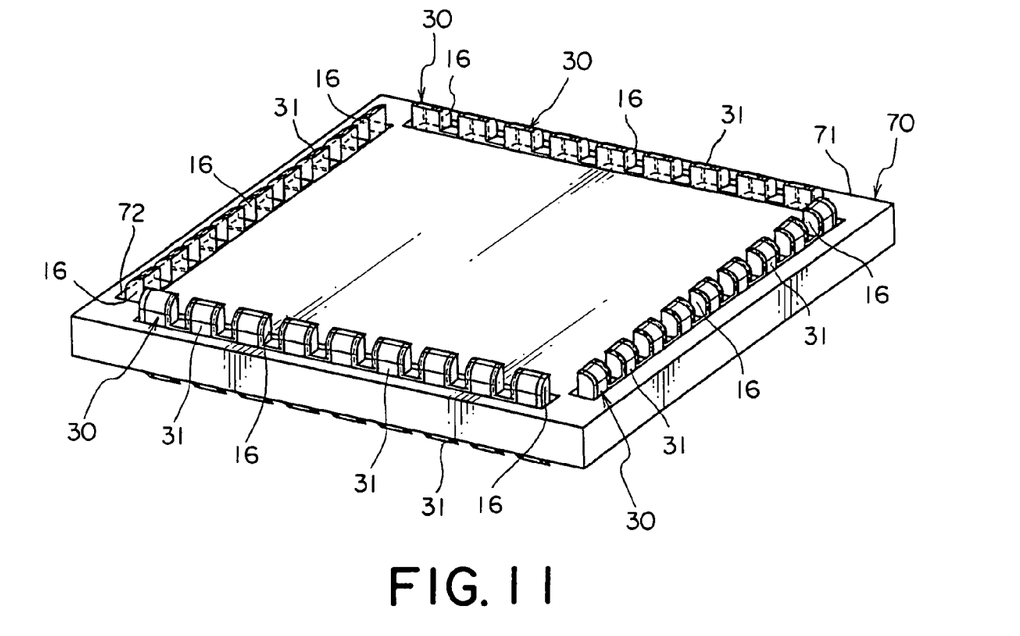
FIG. 11 is a perspective view of a third example of a connector using the electrical connecting member illustrated in FIG. 5.
Figure 12:
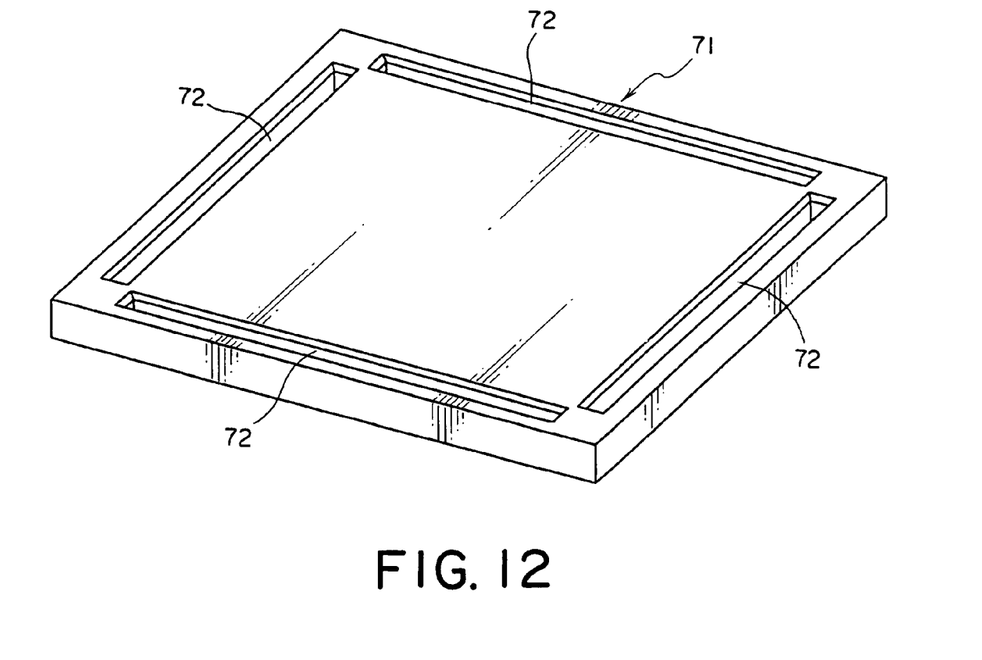
FIG. 12 is a perspective view of an insulator used in the connector illustrated in FIG. 11.

Referring to FIGS. 11 and 12, description will be made of a third example of a connector using the electrical connecting member 30 illustrated in FIG. 5.

A connector 70 illustrated in FIG. 11 comprises an insulator 71 as a frame. As shown in FIG. 12, the insulator 71 has a rectangular flat plate-like shape approximate to a square shape and is provided with four holding holes 72 formed along its edges, respectively. Each of the holding holes 72 is a long through hole penetrating the insulator 71 in a thickness direction. The electrical connecting member 30 is inserted into each of the holding holes 72 and fixed to the insulator 71. In this state, the projections 16 protrude outward from the insulator 71. Therefore, the opposite ends of each conductor portion 31 are also exposed.

In the connector 70, the four holding holes 72 are formed in the insulator 71 in conformity with arrangement of the contacting portions of the connection object. The electrical connecting member 30 adapted to the number and the positions of the contacting portions of the connection object is inserted into each of the holding holes 72 and held therein. The connector 70 mentioned above is simple in structure and is therefore easy in manufacture, high in versatility, and excellent in mass-productivity.

Figure 13:
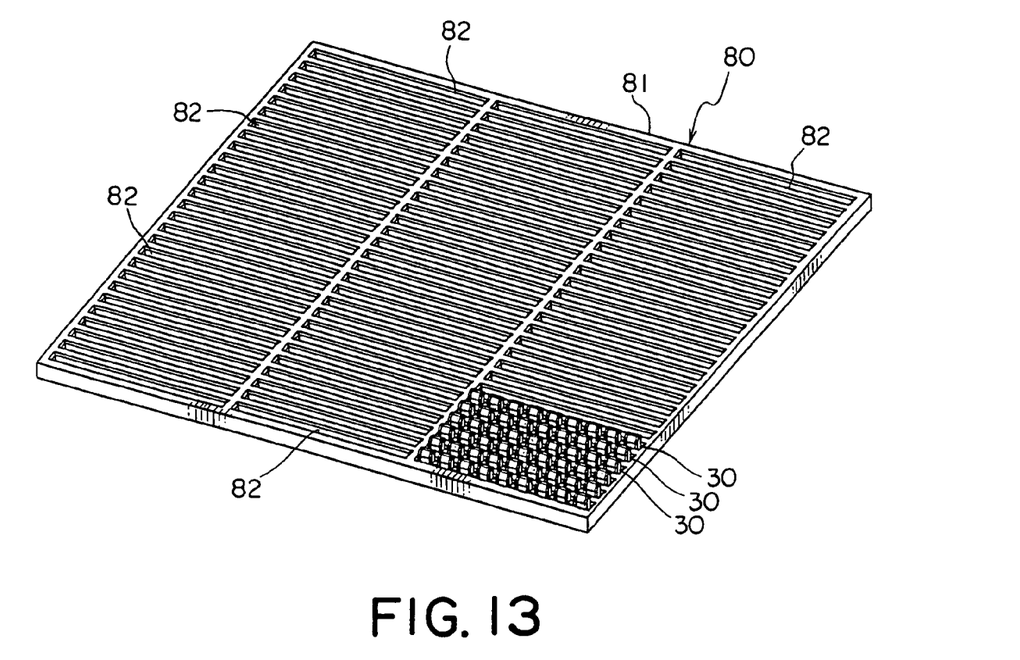
FIG. 13 is a perspective view of a fourth example of the connector using the electrical connecting member illustrated in FIG. 5.
Figure 14:
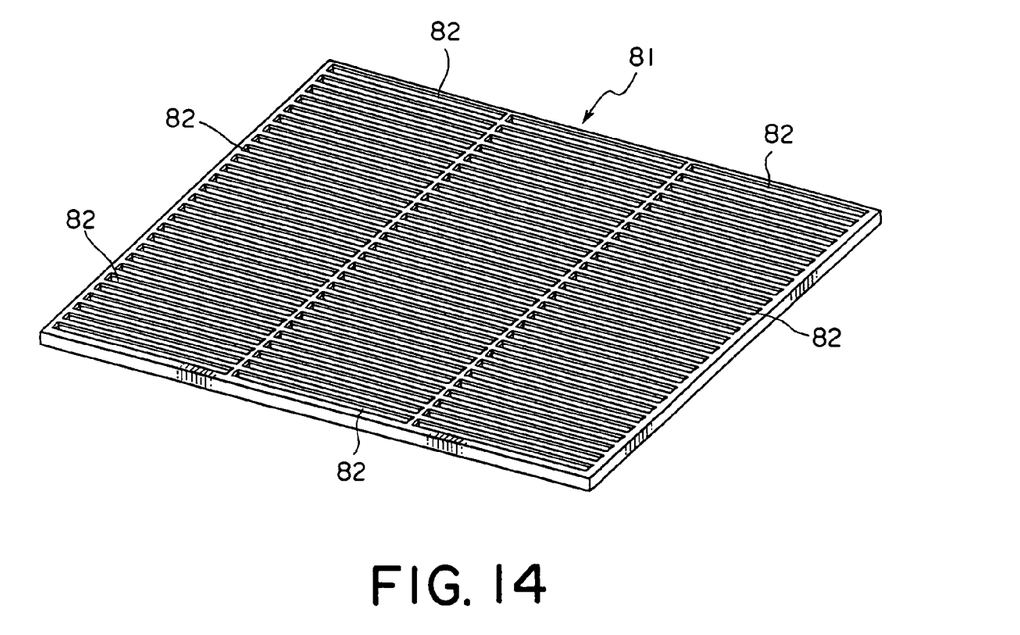
FIG. 14 is a perspective view of an insulator used in the connector illustrated in FIG. 13.

Referring to FIGS. 13 and 14, description will be made of a fourth example of a connector using the electrical connecting member 30 illustrated in FIG. 5.

A connector 80 illustrated in FIG. 13 comprises an insulator 81 as a frame. As shown in FIG. 14, the insulator 81 has a rectangular flat plate-like shape approximate to a square shape and is provided with a number of holding holes 82 formed throughout an entire area of the insulator 81. Each of the holding holes 82 is a long through hole penetrating the insulator 81 in a thickness direction. The electrical connecting member 30 is inserted into each of the holding holes 82 and fixed to the insulator 81. In this state, the projections 16 protrude outward from the insulator 81. Therefore, the opposite ends of each conductor portion 31 illustrated in FIG. 5 are also exposed.

In the connector 80, the holding holes 82 are formed in the insulator 81 in conformity with arrangement of the contacting portions of the connection object. The electrical connecting members 30 adapted to the number and the positions of the contacting portions of the connection object is inserted into each of the holding holes 82 and held therein. The connector 80 mentioned above is simple in structure and is therefore easy in manufacture, high in versatility, and excellent in mass-productivity.

Although the electrical connecting members 30 are held in some of the holding holes 82 in FIG. 13, the electrical connecting members 30 may be held in all of the holding holes 82. In case where the connection object has contacting portions in 20×4 arrangement, an electrical connecting member having 100 contacts may be divided into five parts and inserted into the insulator 81.

Figure 15:
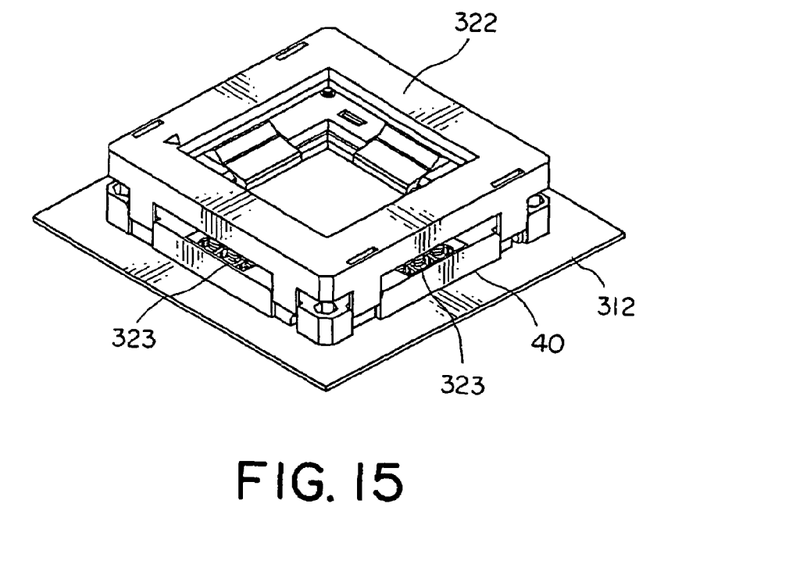
FIG. 15 is a perspective view for describing an example of use of the electrical connecting member illustrated in FIG. 5.

Referring to FIG. 15, description will be made of an example of use of the electrical connecting member 30 illustrated in FIG. 5.

Referring to FIG. 15, a connector is for use with a LGA (Land Grid Array) or a BGA (Ball Grid Array) chip. The connector has a connector element 40 disposed at its lower part and mounted with the electrical connecting members 30 illustrated in FIG. 5. The connector element 40 is mounted on a substrate 312 as a connection object. On the connector element 40, a mating connection object 322 is placed. The connector element 40 is pressed by springs 323.

Figure 16:
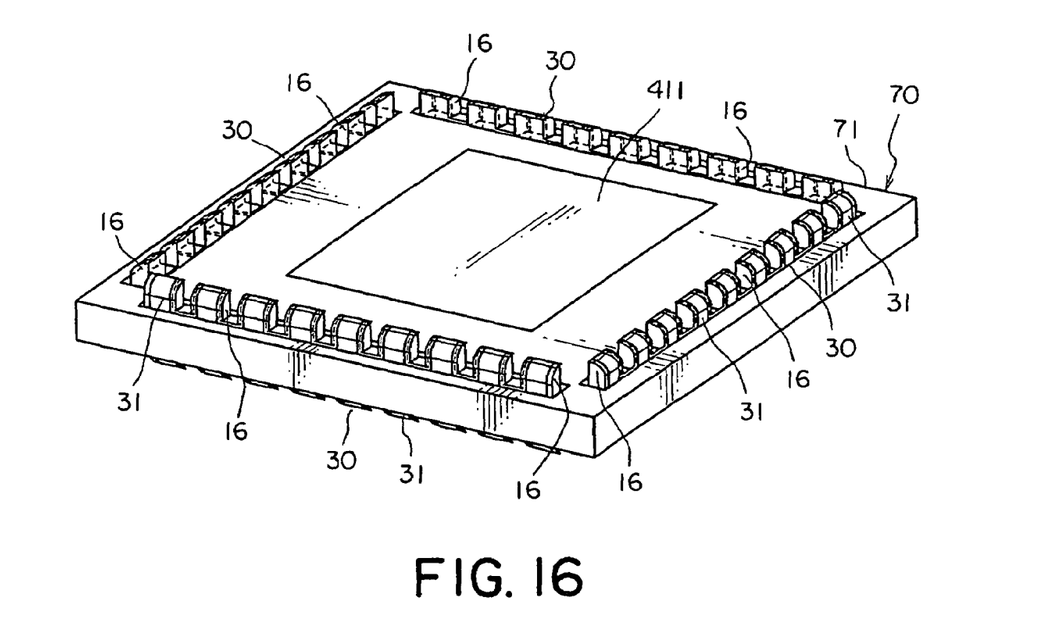
FIG. 16 is a perspective view for describing an example of use of the connector illustrated in FIG. 11.

Referring to FIG. 16, description will be made of an example of use of the connector 70 illustrated in FIG. 11.

In FIG. 16, an adhesive 411 is applied to a center space of the insulator 71 of the connector 70. The adhesive 411 maintains connection of the mating connection object 322 illustrated in FIG. 15 to the connector 70. Instead of the adhesive 411, a double-sided adhesive tape may be attached.

In the examples described in conjunction with FIGS. 15 and 16, no solder is used for connection with the connection object. Therefore, a number of times of repetition of connecting and disconnecting operations are possible in case of occurrence of arrangement error or the like. Therefore, the above-mentioned connector is suitable for connection of an IC chip, a wiring board such as a flexible printed wiring board, a subcarrier, and so on.

Although this invention has been described in conjunction with a few preferred embodiments thereof, this invention may be modified in various other manners within the scope of the appended claims.

What is claimed is:

1. An electrical connecting member for electrical connection with a connection object, the electrical connecting member comprising: an elastic body having a pair of protruding portions protruding in directions opposite to each other; an insulating film extending along the elastic body to cover the protruding portions; and a conductor portion formed along the film and extending between portions corresponding to the protruding portions;

wherein each of the protruding portions has a plurality of projections, adjacent ones of the projections being separated by a groove from one another, the conductor portions being formed in correspondence to the projections; and wherein the film has a cutout portion formed in correspondence to the groove.

2. The electrical connecting member according to claim 1, wherein the film extends to cover the groove.

3. A connector which is disposed between two connection objects faced to each other and which serves to electrically connect the connection objects to each other, the connector comprising: an insulator having a holding hole as a through hole; and an electrical connecting member inserted into the holding hole; the electrical connecting member comprising: an elastic body having a pair of protruding portions protruding from the insulator towards the two connection objects, respectively; an insulating film extending along the elastic body to cover the protruding portions; and a conductor portion formed along the film and extending between portions corresponding to the protruding portions;

wherein each of the protruding portions has a plurality of projections, adjacent ones of the projections being separated by a groove from one another, the conductor portions being formed in correspondence to the projections; and wherein the film has a cutout portion formed in correspondence to the groove.

4. The connector according to claim 3, wherein the film extends to cover the groove.

5. The connector according to claim 3, wherein the insulator has a rod-like shape, the holding hole being a long hole extending in a longitudinal direction of the insulator.

6. The connector according to claim 3, wherein the insulator has a polygonal plate-like shape, the holding hole being a long hole penetrating the insulator in a thickness direction and extending in parallel to an edge of the insulator.

* * * * *